(12) United States Patent
Kurosawa et al.

(10) Patent No.: US 8,956,917 B2
(45) Date of Patent: Feb. 17, 2015

(54) SEMICONDUCTOR DEVICE, AND MANUFACTURING METHOD AND MANUFACTURING APPARATUS OF THE SAME

(75) Inventors: Tetsuya Kurosawa, Yokohama (JP); Shinya Takyu, Saitama-ken (JP); Akira Tomono, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/353,826

(22) Filed: Jan. 19, 2012

(65) Prior Publication Data

US 2012/0187542 A1    Jul. 26, 2012

(30) Foreign Application Priority Data

Jan. 21, 2011  (JP) ................. P2011-010875
Jul. 22, 2011  (JP) ................. P2011-160586

(51) Int. Cl.
*H01L 21/78*   (2006.01)
*H01L 29/30*   (2006.01)
*H01L 21/683*  (2006.01)

(52) U.S. Cl.
CPC ............ *H01L 21/78* (2013.01); *H01L 21/6836* (2013.01)
USPC ............................ 438/113; 438/110; 438/114

(58) Field of Classification Search
CPC ................................ H01L 21/78; H01L 29/30
USPC .................................... 438/460, 83, 225, 462
See application file for complete search history.

(56) References Cited

U.S. PATENT DOCUMENTS 7,140,951 B2 *  11/2006  Kurosawa ................... 451/54
7,259,055 B2 *  8/2007   Li et al. ...................... 438/225

(Continued)

FOREIGN PATENT DOCUMENTS

JP     04-354352      12/1992
JP     2004-221187    8/2004

(Continued)

OTHER PUBLICATIONS

Hironori Akiba et al.,"Development of High Speed High Precision Cooling Plate",2004,Komatsu Technical Report,vol. 50 No. 153, pp. 1-6.*

(Continued)

*Primary Examiner* — Matthew Landau
*Assistant Examiner* — Damon Hillman
(74) *Attorney, Agent, or Firm* — Oblon, Spivak, McClelland, Maier & Neustadt, L.L.P.

(57) ABSTRACT

According to one embodiment, a manufacturing method of a semiconductor device is disclosed. The method includes: (a) forming cutting grooves in an element formation surface of a semiconductor wafer on which semiconductor elements are formed; (b) applying a protection tape on the element formation surface of the semiconductor wafer; (c) grinding a rear surface of the semiconductor wafer to thin the semiconductor wafer and to divide the semiconductor wafer into a plurality of semiconductor chips on which the semiconductor elements are formed; (d) forming an adhesive layer on the rear surface of the semiconductor wafer; (e) separating and cutting the adhesive layer for each of the semiconductor chips; and (f) removing the protection tape. The (e) is performed by spraying a high-pressure air to the adhesive layer formed on the rear surface of the semiconductor wafer while melting or softening the adhesive layer by heating.

14 Claims, 6 Drawing Sheets

(56) References Cited

U.S. PATENT DOCUMENTS

| | | |
|---|---|---|
| 7,605,054 B2 * 10/2009 | Celler | 438/456 |
| 2001/0027986 A1 * 10/2001 | Dautartas et al. | 225/1 |
| 2004/0070087 A1 4/2004 | Wang et al. | |
| 2005/0003636 A1 * 1/2005 | Takyu et al. | 438/464 |
| 2005/0196899 A1 * 9/2005 | Shimizu et al. | 438/113 |
| 2010/0068631 A1 * 3/2010 | Lee et al. | 430/5 |

FOREIGN PATENT DOCUMENTS

| | | |
|---|---|---|
| JP | 2008-270282 | 11/2008 |
| TW | 200723495 A | 6/2007 |

OTHER PUBLICATIONS

Akiba et al., "Development of High-Speed High-Precision Cooling Plate" 2004 vol. 50 No. 153, Komatsu Techincal Report, pp. 1-6.*

Taiwanese Office Action mailed on Dec. 26, 2013, in Taiwanese Patent Application No. 101101628 (with English-language translation).

Office Action issued Jan. 28, 2014, in Chinese patent Application No. 201210017248.X (with English-language translation).

Office Action issued Jul. 29, 2014 in Japanese Patent Application No. 2011-160586 (with English Translation).

Office Action issued Sep. 3, 2014 in Chinese Patent Application No. 2012-10017248.X (with English translation).

* cited by examiner

SEMICONDUCTOR DEVICE, AND MANUFACTURING METHOD AND MANUFACTURING APPARATUS OF THE SAME

CROSS-REFERENCE TO RELATED APPLICATIONS

This application is based upon and claims the benefit of priority from the prior Japanese Patent Applications No. 2011-010875, filed on Jan. 21, 2011, and No. 2011-160586, filed on Jul. 22, 2011; the entire contents of all of which are incorporated herein by reference.

FIELD

Embodiments described herein relate to a semiconductor device, and a manufacturing method and a manufacturing apparatus of the same.

BACKGROUND

In recent years, a technique called a dicing-before-grinding process has been used in order to obtain individual semiconductor chips from a semiconductor wafer on which elements are formed.

In this dicing-before-grinding process, cutting grooves are first formed in a front surface (element formation surface) of the semiconductor wafer (half-cut dicing). Next, after a protection tape is applied on the front surface of the semiconductor wafer in which the cutting grooves are formed, a rear surface of the semiconductor wafer is ground up to the cutting groove portions. Consequently, the thickness of the semiconductor wafer decreases and the semiconductor wafer is divided (separated) into the individual semiconductor chips. On the rear surface of the divided semiconductor wafer, an adhesive film (die-attachment film) is applied to form an adhesive layer, and the protection tape on the front surface (element formation surface) is removed. Then, from the front surface side of the semiconductor wafer, the adhesive layer is cut along the dividing grooves by a diamond blade, a laser, or the like. Consequently, the semiconductor chips with the adhesive layer are obtained. This semiconductor chip with the adhesive layer is thereafter picked up by a sucking tool called a collet and is stacked and bonded on a substrate or another semiconductor chip.

In this method, however, since an alignment state of the semiconductor chips after the protection tape is removed is not good, there are possibilities that, when the adhesive film is cut, wiring regions of the elements might be partly cut and the surfaces might get dirty due to cutting chips, or when the semiconductor chips are picked up after the cutting, the chips might be cracked due to a load and thermal welding at the time of the cutting.

DETAILED DESCRIPTION

In general, according to one embodiment, a manufacturing method of a semiconductor device is disclosed. The method includes: (a) forming cutting grooves in an element formation surface of a semiconductor wafer on which semiconductor elements are formed; (b) applying a protection tape on the element formation surface of the semiconductor wafer; (c), grinding a rear surface of the semiconductor wafer to thin the semiconductor wafer and to divide the semiconductor wafer into a plurality of semiconductor chips on which the semiconductor elements are formed; (d) forming an adhesive layer on the rear surface of the semiconductor wafer; (e) separating and cutting the adhesive layer for each of the semiconductor chips; and (f) removing the protection tape. The above (e) is performed by spraying a high-pressure air to the adhesive layer formed on the rear surface of the semiconductor wafer while melting or softening the adhesive layer by heating.

According to another embodiment, a semiconductor manufacturing apparatus is disclosed. This apparatus includes: a heater heating an adhesive layer of a semiconductor wafer divided into a plurality of semiconductor chips, the semiconductor chips being integrated by the adhesive layer formed entirely on rear surfaces the chips; and a high-pressure air generator including a nozzle spraying a high-pressure air to the adhesive layer.

Hereinafter, an embodiment will be described with reference to the drawings.

Figure 1A:
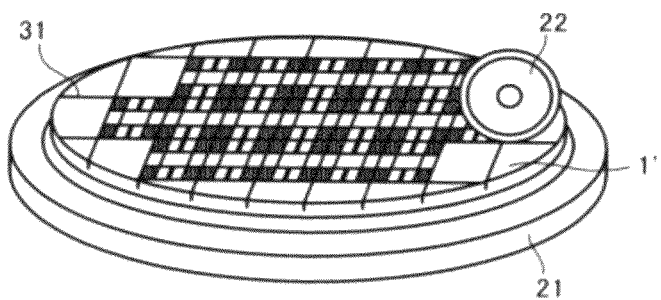
FIG. 1A to FIG. 1H are schematic perspective views illustrating manufacturing steps of a semiconductor device according to an embodiment.

In this embodiment, after semiconductor elements are first formed on a front surface (element formation surface) of a semiconductor wafer 1' made of silicon or the like, the semiconductor wafer 1' on which the semiconductor elements are formed is fixed on a holding table 21, and cutting grooves 31 not reaching a rear surface of the semiconductor wafer 1' are formed from the element formation surface side of the semiconductor wafer 1' along dicing lines (or chip dividing lines) by using a diamond blade 22. That is, half-cut dicing is performed (FIG. 1A). A means for forming the cutting grooves 31 is not limited to the diamond blade 22, but a diamond scriber, a laser, or the like is usable. A means such as reactive gas etching, reactive ion etching (RIE), or the like is also usable.

Figure 1B:
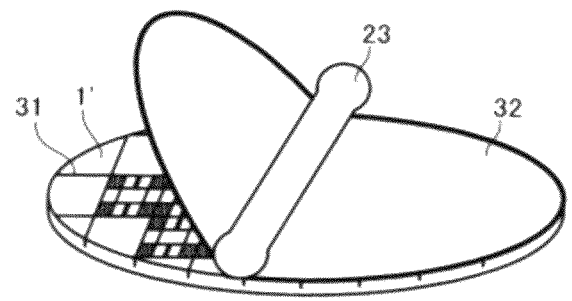

Next, a protection tape 32 is applied on the element formation surface of the semiconductor wafer 1' to form a surface protection layer (FIG. 1B). As the protection tape 32, used is, for example, a pressure sensitive adhesive tape or the like having a pressure sensitive adhesive layer provided on a tape base material made of thermoplastic resin such as polyvinyl chloride resin (PVC), polyethylene telephthalate resin (PET), or polyolefin resin (PO). Instead of the protection tape 32, one having a pressure sensitive adhesive layer provided on a base material made of glass or the like is also usable. The pressure sensitive adhesive may be of a light-curing type. The protection tape 32 is removed in a later step, and when the pressure sensitive adhesive tape whose pressure sensitive adhesive is of a light-curing type is used, the protection tape 32 can be easily removed by being irradiated with light before removed. In FIG. 1B, the reference 23 denotes a pressing member for bringing the protection tape 32 into close contact with the element formation surface of the semiconductor wafer 1'.

Figure 1C:
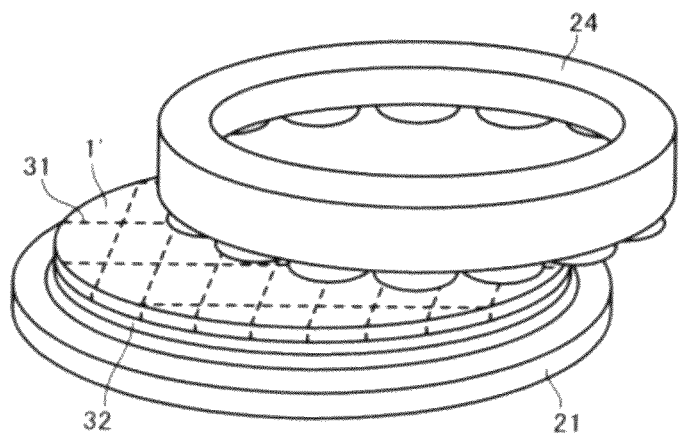
Figure 1D:
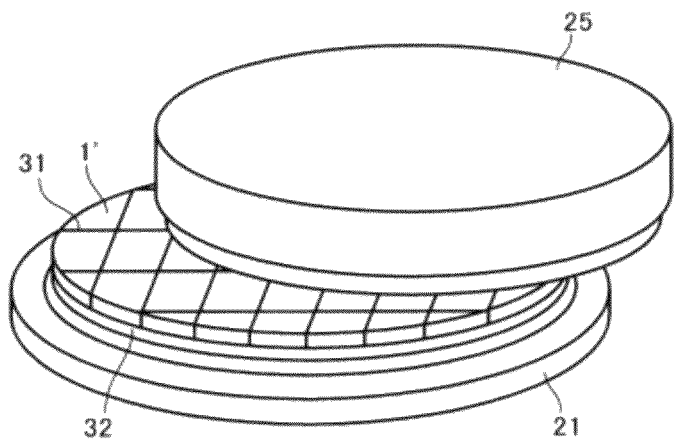

Next, a grindstone 24 grinds the rear surface of the semiconductor wafer 1' to thin the semiconductor wafer 1' and to divide the semiconductor wafer 1' into individual semiconductor chips 1 (FIG. 1C). In this separation step, etching by an etching apparatus 25 may follow the grinding by the grindstone 24 (FIG. 1D). The etching may be any of dry etching, plasma etching, and wet etching. Further, the etching may be replaced by planarization by CMP (chemical mechanical polishing). The etching or the planarization following the grinding enables a reduction in rear surface chipping.

Figure 1E:
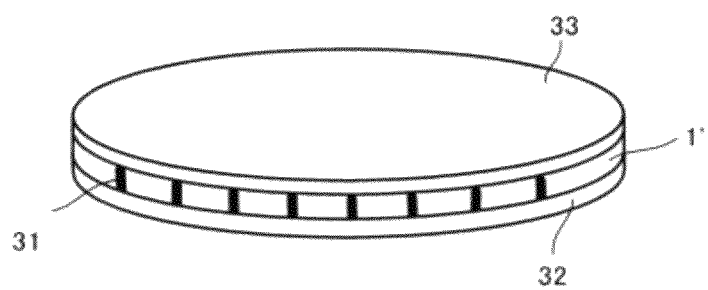
Figure 1F:
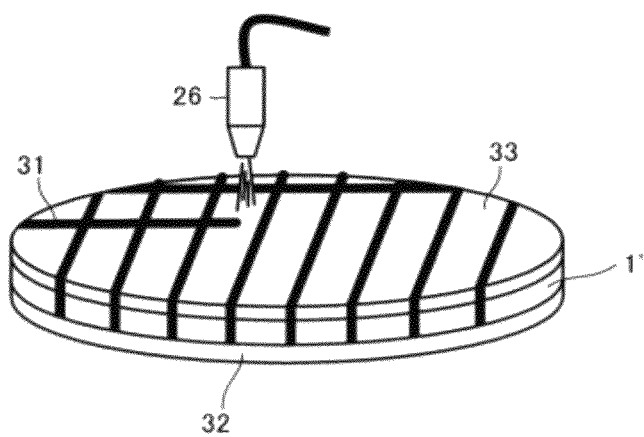

After the grinding of the rear surface or after the grinding of the rear surface and the etching (or planarization), an adhesive film 35 is applied on the rear surface of the semiconductor wafer 1' to form an adhesive layer 33 (FIG. 1E), and the adhesive layer 33 is further cut into a chip size (FIG. 1F). Steps from the applying of the adhesive film 35 to the cutting of the adhesive layer 33 into the chip size are performed in a manner shown in FIG. 2A to FIG. 2D, for instance.

Figure 2A:
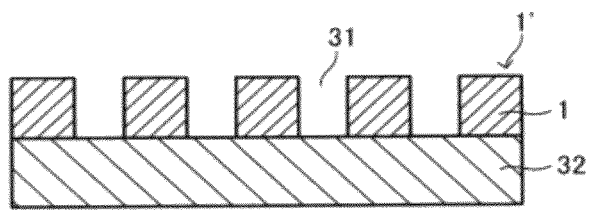
FIG. 2A to FIG. 2D are cross-sectional views illustrating the steps illustrated in FIG. 1E and FIG. 1F in more detail.

FIG. 2A is a cross-sectional view illustrating the semiconductor wafer 1' after the step in FIG. 1C or FIG. 1D is finished. The element formation surface of the semiconductor wafer 1' separated into the individual semiconductor chips 1 has the protection tape 32 applied thereon.

Figure 2B:
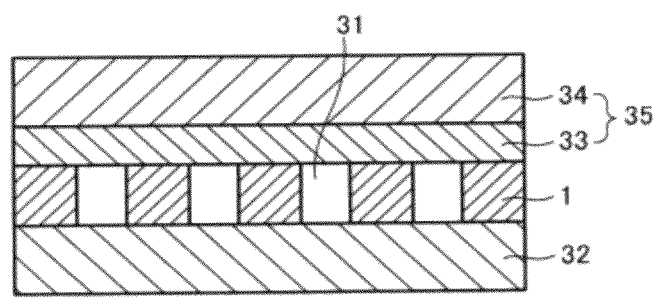
Figure 2C:
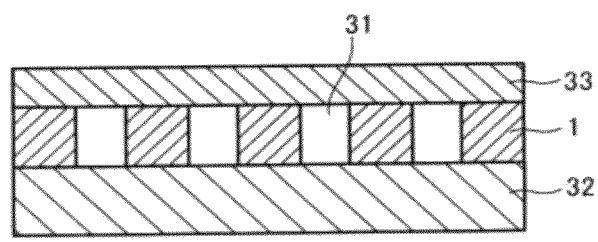

The adhesive film 35 in which the adhesive layer 33 is provided on a film base material 34 is applied on the rear surface of the semiconductor wafer 1' on which the protection tape 32 is applied, with the adhesive layer 33 side facing the semiconductor wafer 1' side (FIG. 2B). Next, the film base material 34 of the adhesive film 35 is removed (FIG. 2C).

Figure 2D:
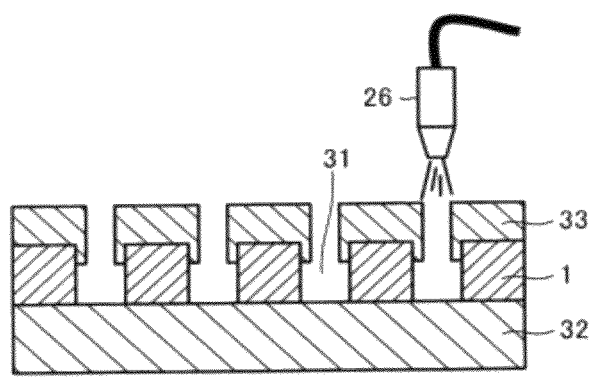

Next, a high-temperature high-pressure air is sprayed toward the adhesive layer 33 (FIG. 2D). In FIG. 1F and FIG. 2D, the reference 26 denotes a nozzle connected to a high-temperature high-pressure air generator (not shown), and the high-temperature high-pressure air is sprayed toward the adhesive layer 33 from the nozzle 26. Since the air sprayed to the adhesive layer 33 has a high temperature, the adhesive layer 33 melts or softens, and when the high pressure of the air is applied to the melted or softened adhesive layer 33, the adhesive layer 33 is cut along the cutting grooves 31 and its cutting ends are wrapped around to side surfaces of the individual semiconductor chips 1 to be disposed thereon.

The high-temperature high-pressure air may be sprayed to the whole surface of the adhesive layer 33 or may be sprayed along the cutting grooves 31. Further, when the high-pressure air is sprayed along the cutting grooves 31, it may be sprayed to narrower ranges than a groove width of the cutting grooves 31, or may be sprayed to wider ranges than the groove width. In FIG. 2D and FIG. 1F, a tip of the nozzle 26 is structured to move along the cutting grooves 31, and the high-temperature high-pressure air is sprayed to the adhesive layer 33 along the cutting grooves 31.

Further, the temperature of the sprayed air only needs to be high enough to at least soften the adhesive layer 33, and is normally within a range of not lower than 50° C. nor higher than 200° C., though depending on the kind of the adhesive, and preferably is within a range of not lower than 60° C. nor higher than 120° C. Further, a pressure of the air is preferably 0.15 MPa or more, and more preferably 0.3 MPa or more. When the pressure of the air is less than 0.15 MPa, the adhesive layer 33 might not be cut. Further, a flow rate of the air is preferably 0.0005 m$^3$/s or more and more preferably 0.0008 m$^3$/s or more. Here, the aforesaid air temperature is not an air temperature at an injection port of the nozzle but refers to a temperature when the air reaches the adhesive layer 33 at the cutting groove 31 portions, that is, a surface temperature of the adhesive layer 33 at the cutting groove 31 portions.

In this embodiment, the adhesive film 35 in which the adhesive layer 33 is provided on the film base material 34 is used for the formation of the adhesive layer 33, but an adhesive film only including the adhesive layer 33 is also usable. In this case, it is possible to dispense with the step of removing the film base material 34, illustrated in FIG. 2C Further, in this embodiment, the high-temperature high-pressure air is sprayed, but another alternative may be to melt or soften the adhesive layer 33 by a different heating means and spray a room-temperature high-pressure air.

Figure 3:
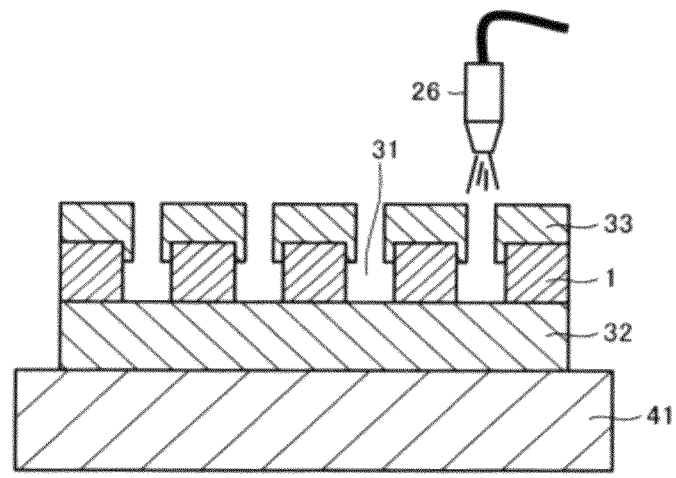
FIG. 3 is a cross-sectional view illustrating a modification example of the step illustrated in FIG. 2D.

Further, it is also possible to perform the step of cutting the adhesive layer 33 along the cutting grooves 31, that is, the step in FIG. 1F, on a cooling stage 41 as illustrated in FIG. 3, to thereby prevent the protection tape 32 applied on the front surface of the semiconductor wafer 1' from suffering thermal degradation due to the spraying of the high-temperature high-pressure air or due to the heating of the adhesive layer 33 by the other heating means.

Alternatively, this step can be performed on a heating stage as a preliminary or auxiliary heating means of the adhesive layer 33. This enables the adhesive layer 33 to soften or melt in a shorter time and enables to reduce the cutting time and cutting work efficiency. Especially when the high-temperature high-pressure air is sprayed to the adhesive layer 33 while the tip of the nozzle 26 is moved along the cutting grooves 31 as illustrated in FIG. 2D and FIG. 1F, the preliminary or auxiliary heating of the adhesive layer 33 can achieve a higher machining (cutting) speed and improved cutting stability.

Figure 4:
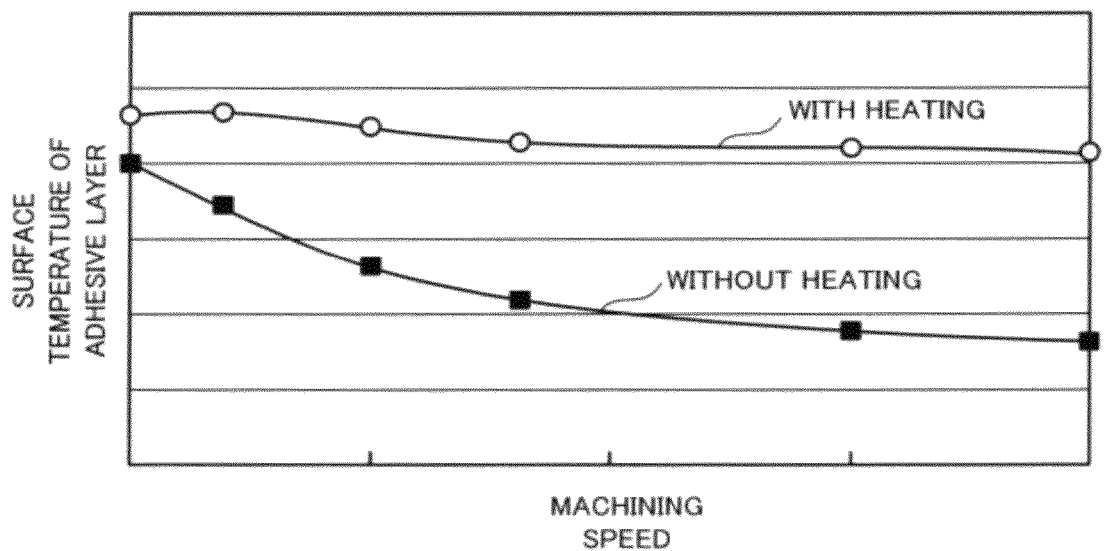
FIG. 4 is a graph showing an effect when the step in FIG. 1F is performed on a heating stage.

Specifically, FIG. 4 is a graph showing a correlation between the surface temperature of the adhesive layer 33 and the machining speed (moving speed of the nozzle 26) when the step in FIG. 1F is performed on a heating stage that is controlled at a predetermined temperature and thus the adhesive layer 33 is cut by being sprayed with the high-temperature high-pressure air while being heated, and the correlation when the adhesive layer 33 is cut by being sprayed with the high-temperature high-pressure air without being heated. The vertical axis shows the surface temperature of the adhesive layer 33 and the horizontal axis shows the machining speed. Note that cutting conditions and methods in the former and latter cases are the same except that the adhesive layer 33 is heated or not.

As is apparent from FIG. 4, when the adhesive layer 33 is not heated on the heating stage, the surface temperature of the adhesive layer 33 greatly decreases in accordance with an increase in the machining speed, but on the other hand, when the adhesive layer 33 is cut while being heated on the heating stage, the surface temperature of the adhesive layer 33 is kept substantially constant even when the machining speed is increased. This indicates that in the former, if the machining speed is increased, it might not be possible to perform the cutting because the surface temperature of the adhesive layer 33 decreases, but in the latter, even when the machining speed is increased, the adhesive layer 33 can be kept at a predetermined temperature, enabling the stable cutting. From this, it is seen that heating the adhesive layer 33 on the heating stage during the cutting enables high-speed machining and enhanced cutting stability.

Note that the temperature of the preliminary or auxiliary heating of the adhesive layer 33 is preferably set to a temperature within a range not causing the thermal degradation of the protection tape 32 because too high a temperature might cause the thermal degradation of the protection tape 32 applied on the front surface of the semiconductor wafer 1' as previously described.

Figure 1G:
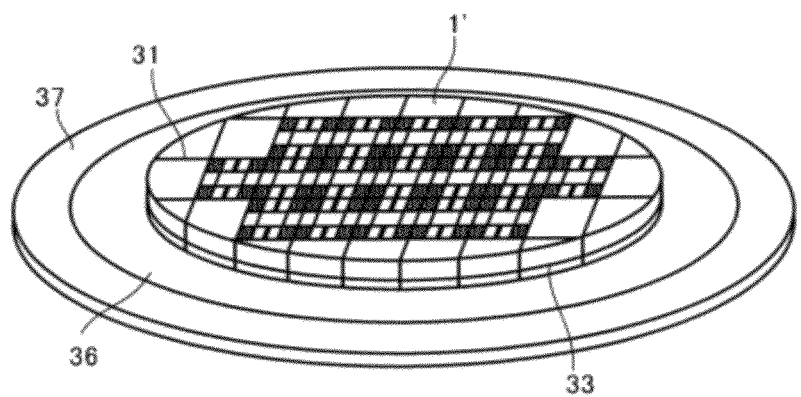

After the adhesive layer 33 is formed on the rear surface of the semiconductor wafer 1' and the adhesive layer 33 is cut into the chip size in this manner, the protection tape 32 is removed from the semiconductor wafer 1' separated into the individual semiconductor chips 1 (FIG. 1G). At this time, as illustrated in FIG. 1G, the semiconductor wafer 1' separated into the individual semiconductor chips 1 is held on a film 36 applied on a wafer ring 37, with its protection tape 32 side facing upward, and the protection tape 32 is removed. The film 36 may be one having tackiness or may be one not having tackiness. Further, the semiconductor wafer 1' may be directly held on a holding table or the like, without the film 36 being used.

Figure 1H:
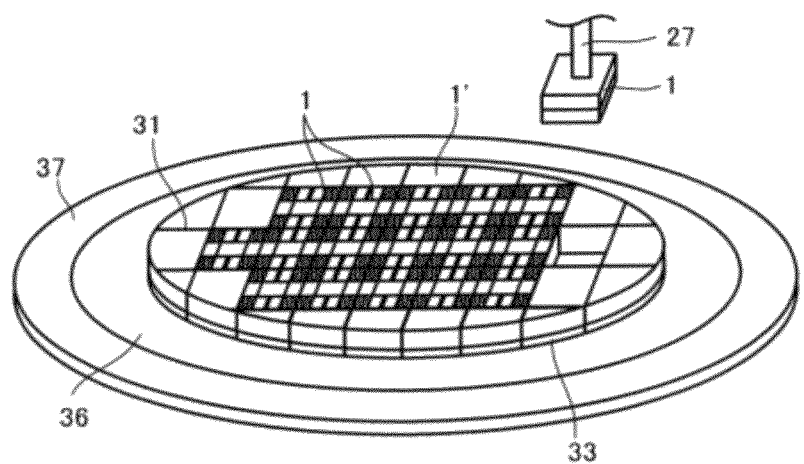

The semiconductor chips 1 forming the semiconductor wafer 1' with the protection tape 32 being removed and with the adhesive layer provided on the rear surface are picked up by a pickup mechanism including a sucking collet 27, and are each carried to a predetermined manufacturing step of a semiconductor device, such as a step of mounting it to a substrate or another semiconductor chip (FIG. 1H).

According to this embodiment, when the adhesive layer formed on the rear surface of the semiconductor wafer 1' separated into the individual semiconductor chips is cut, the adhesive layer is cut by the air pressure after being melted or softened, and therefore, there occurs no partial cutting of the semiconductor elements or no surface contamination by cutting chips as occurring in the conventional cutting using a blade, and there occurs no crack of the semiconductor chips when they are picked up as occurring when a laser is used.

In addition, since the cutting ends of the adhesive layer are disposed on the side surfaces of the semiconductor chips, it is possible to prevent the occurrence of "sink (shrink)", "projection", and the like in the cutting ends of the adhesive layer. Specifically, the "sink" occurs due to distortion at the time of the formation of the adhesive layer, and when the "sink" is present, the semiconductor chips might suffer breakage or crack due to the entrance of a filler contained in a sealing material when they are mounted. Further, connection failure might occur when the semiconductor chips are mounted, due to insufficient wetting. Further, the "projection" refers to a phenomenon that the cutting ends project from the semiconductor chips, and the presence of the "projection" might obstruct the mounting due to the bending or the like of the projecting portions to the rear side. In this embodiment, since the cutting ends of the adhesive layer are wrapped around to the side surfaces of the semiconductor chips to be disposed thereon, the occurrence of such "sink" and "projection" is prevented.

Figure 5:
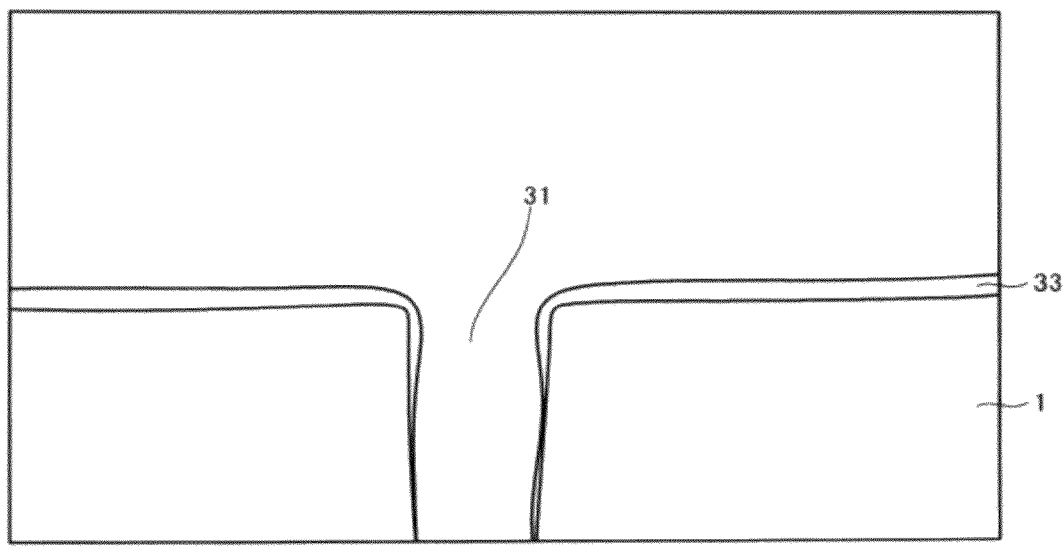
FIG. 5 is an imitative view of a photo obtained when a cross section of an adhesive layer cut by the application of the embodiment is photographed with the use of a metallographic microscope.

FIG. 5 is an imitative view of a photo obtained when a cross section of the adhesive layer 33 which is cut by the application of this embodiment is photographed by using a metallographic microscope. In this example, the adhesive layer 33 with a 7 μm thickness was cut, and it was confirmed that its cutting ends were disposed on the side surfaces of the semiconductor chips 1 up to an about 20 μm depth (about 1/7 to about 1/6 of the depth 130 mm of the cutting grooves 31). Conditions of the air used for the cutting of the adhesive layer 33 are as follows.

temperature: 100° C., pressure: 0.4 MPa

In order to prevent the aforesaid "sink (shrink)" and "projection", the cutting ends of the adhesive layer 33 preferably cover the side surfaces of the semiconductor chips 1 at least up to a 5 μm depth from the rear surface, when the thickness of the semiconductor chips 1 is about 20 μm. In general, the side surface of each of the semiconductor chips 1 is preferably covered by the cutting end of the adhesive layer up to at least one-eighth the depth, more preferably one-fourth the depth, even more preferably one-half the depth, of the cutting grooves 31. Most preferred is a whole side surface of each of the semiconductor chips 1.

Figure 6:
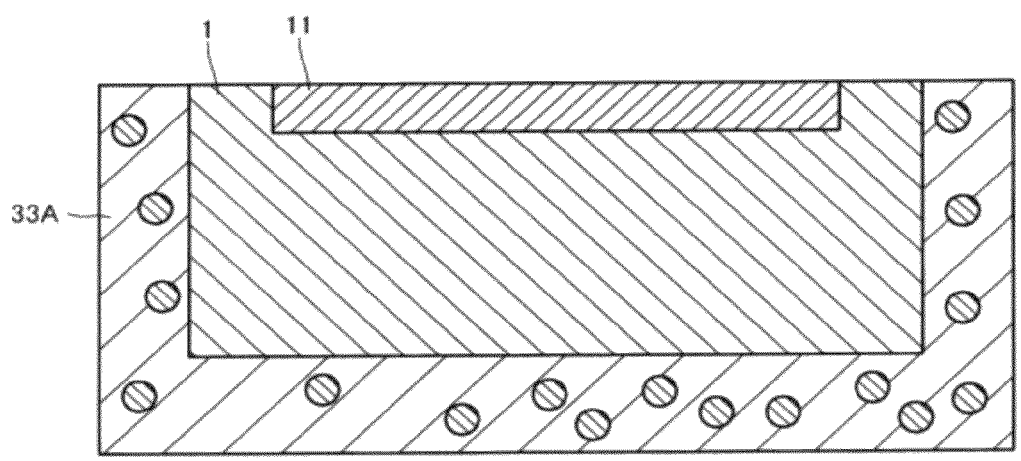
FIG. 6 is a cross-sectional view illustrating a modification example of the step illustrated in FIG. 1E.

In this embodiment, as the adhesive film, one whose adhesive layer contains an agent for trapping metal impurity ions may be used. A problem of contamination to a semiconductor element by a trace amount of metal impurities has recently arisen in accordance with the miniaturization of semiconductor elements, the thinning of semiconductor chips, and the like. In particular, the contamination by metal ions such as Cu, Fe, Au, Na ions and the like being mobile ions whose diffusion speed in a semiconductor wafer is high has become a problem. Therefore, there has been developed an adhesive film in which such a ion trapping agent is added to prevent the entrance of the metal ion impurities into a semiconductor wafer. In this embodiment, such an adhesive film containing a ion trapping agent is usable. In this embodiment, since the cutting ends of the adhesive layer are disposed up to the side surfaces of the semiconductor chips as previously described, it is possible to prevent the entrance of the metal ion impurities not only from the rear surfaces of the semiconductor chips but from their side surfaces. In view of preventing the entrance of the metal ion impurities to the semiconductor chips, cutting ends of an adhesive layer 33A containing the ion trapping agent are preferably disposed on the whole side surfaces of the semiconductor chips 1 as illustrated in FIG. 6. That is, the adhesive layer 33 preferably covers the whole side surfaces of the semiconductor chips 1. In FIG. 6, 11 denotes the semiconductor element formed on the front surface of the semiconductor chip 1.

Where the contamination by the metal ion impurities becomes problematic is especially a semiconductor chip whose rear surface has undergone mirror polishing (for example, CMP, dry polishing, or the like), usually having a thickness of about 20 μm to about 50 μm. When the rear surface is rough, the contamination by the metal ion impurities is thought to cause substantially no problem. Possible reasons for this are that the rough rear surface functions as a so-called gettering site of the metal impurity ions, that the semiconductor chip having a rough rear surface usually has a large thickness and thus only a small amount of the metal impurity ions, even if entering, reach a semiconductor element on its front surface, and so on. Therefore, especially when a semiconductor chip has a mirror-polished rear surface, an adhesive film containing the metal impurity ion trapping agent is preferably used, and in this case, the whole side surfaces of the semiconductor chips 1 are preferably covered by the adhesive layer 33A containing the ion trapping agent as illustrated in FIG. 6. When semiconductor chips have an about 20 μm to about 50 μm thickness, it is possible for the adhesive layer to cover the whole side surfaces of the semiconductor chips by adjusting cutting conditions such as temperature and pressure of the air and a heating temperature of the adhesive layer (when it is heated).

An example of the adhesive film containing the ion trapping agent suitably used in this embodiment is one containing one kind or more selected from a complexing agent, an inorganic ion exchanger, and a metal powder. The complexing agent has a property of forming a complex by bonding with metal ions, and examples thereof are phenol, cresol, catechol, resorcinol, dihydroxybenzophenone, and so on. The inorganic ion exchanger takes ions therein, and instead, releases other ions that the inorganic ion exchanger has, to exchange part of the inorganic ion exchanger. Examples of the inorganic ion exchanger are an oxide, a phosphoric acid compound, and the like, such as a zirconium-based compound, an antimony-based compound, a bismuth-based compound, an antimony-bismuth-based compound, a magnesium-aluminum-based compound, and the like. The metal powder traps metal impurity ions by using a plurality of dangling bonds present on its surface or the like as a gettering site, and examples thereof are silicon powder (amorphous silicon, polycrystalline silicon, or the like) and so on. A content of the ion trapping agents in the adhesive layer is usually 20 vol % or less, preferably 10 vol % or less.

Further, in this embodiment, the adhesive layer is formed on the rear surface of the semiconductor wafer on whose front surface the semiconductor elements are formed, but the adhesive layer can be formed on the front surface of the semiconductor wafer, that is, on the semiconductor element formation surface. It is also possible to cut the adhesive layer 33 thus formed on the front surface of the semiconductor wafer along the cutting grooves 31, by the same method as that previously described, that is, by spraying the high-pressure air to the adhesive layer while heating the adhesive layer, and accordingly it is possible to obtain semiconductor chips each including the adhesive layer on the semiconductor element formation surface. The semiconductor chip including the adhesive layer on its semiconductor element formation surface is useful as a semiconductor chip that is to be mounted on a substrate or on another semiconductor chip by flip-chip connection.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A manufacturing method of a semiconductor device, comprising:
    (a) forming cutting grooves in an element formation surface of a semiconductor wafer on which semiconductor elements are formed;
    (b) applying a protection tape on the element formation surface of the semiconductor wafer;
    (c) grinding a rear surface of the semiconductor wafer to thin the semiconductor wafer and to divide the semiconductor wafer into a plurality of semiconductor chips on which the semiconductor elements are formed;
    (d) forming an adhesive layer on the rear surface of the semiconductor wafer;
    (e) spraying a high-pressure air to the adhesive layer formed on the rear surface of the semiconductor wafer while melting or softening the adhesive layer by heating, to separate and cut the adhesive layer for each of the semiconductor chips; and
    (f) removing the protection tape.

2. The method according to claim 1,
wherein (e) is performed so as to cause a cutting end of the adhesive layer to cover at least part of a side surface of each of the semiconductor chips.

3. The method according to claim 2,
wherein the side surface of each of the semiconductor chips is covered by the cutting end of the adhesive layer up to at least a 5 μm depth from the rear surface.

4. The method according to claim 2,
wherein the side surface of each of the semiconductor chips is covered by the cutting end of the adhesive layer up to at least one-eighth of the depth of the cutting grooves from the rear surface.

5. The method according to claim 1,
wherein in (e), the adhesive layer is simultaneously sprayed and heated by using a high-temperature high-pressure air as the spraying air.

6. The method according to claim 5,
wherein a temperature of the high-temperature high-pressure air is within a range of not lower than 50° C. nor higher than 200° C.

7. The method according to claim 5,
wherein a pressure of the high-temperature high-pressure air is 0.15 MPa or more.

8. The method according to claim 5,
wherein the high-temperature high-pressure air is sprayed to the adhesive layer at a flow rate of 0.005 m$^3$/s or more.

9. The method according to claim 1,
wherein in (e), the high-pressure air is sprayed along the cutting grooves.

10. The method according to claim 1,
wherein (e) is performed while the semiconductor wafer is placed on a cooling stage and the protection tape applied on the semiconductor wafer is cooled.

11. The method according to claim 1,
wherein (e) includes mounting the semiconductor wafer on a heating stage and applying preliminary or auxiliary heating to the adhesive layer.

12. The method according to claim 1,
wherein the adhesive layer contains a trapping agent for a metal impurity ion.

13. The method according to claim 12,
wherein the metal impurity ion is at least one kind selected from Cu, Fe, Au, and Na ions.

14. The method according to claim 12,
wherein a substantially whole side surface of each of the semiconductor chips is covered by a cutting end of the adhesive layer.

* * * * *